United States Patent [19]
Honda et al.

[11] Patent Number: 5,369,298
[45] Date of Patent: Nov. 29, 1994

[54] BIPOLAR TRANSISTOR HAVING AN EMITTER WITH INTERDIGITATED COMB-SHAPED INNER AND OUTER EDGER

[75] Inventors: Ziro Honda, Itami; Yasushi Nomoto, Kawanishi, both of Japan

[73] Assignee: Mitsubishi Denki Kabushiki Kaisha, Tokyo, Japan

[21] Appl. No.: 88,054

[22] Filed: Jul. 8, 1993

[30] Foreign Application Priority Data

Jul. 30, 1992 [JP] Japan .................... 4-203725

[51] Int. Cl.⁵ .................. H01L 27/082; H01L 29/70
[52] U.S. Cl. ...................... 257/583; 257/591; 257/539; 257/582
[58] Field of Search ........... 257/591, 592, 593, 583, 257/582, 539, 586

[56] References Cited

U.S. PATENT DOCUMENTS 977,020  8/1976  Enzlin et al. .................... 257/539

Primary Examiner—Rolf Hille
Assistant Examiner—Wael M. Fahmy
Attorney, Agent, or Firm—Leydig, Voit & Mayer

[57] ABSTRACT

A semiconductor device has a semiconductor substrate including a base region and an emitter region in the base region. The emitter region in the base region has a comb-teeth-shaped outer edge. The emitter region has a window through which the base region is exposed. The window has an extended ares to reach portions of the emitter region near the comb-teeth-shaped outer edge of the emitter region. Consequently, the area of junction between the window and the emitter region os increased to suppress concentration of electrical current in the window and to improve electrical characteristics such as secondary yield breakdown strength.

2 Claims, 3 Drawing Sheets

BIPOLAR TRANSISTOR HAVING AN EMITTER WITH INTERDIGITATED COMB-SHAPED INNER AND OUTER EDGER

BACKGROUND OF THE INVENTION

1. Field of the Invention

The present invention relates to a semiconductor device and, more particularly, to a semiconductor device such as a power transistor constructed by triple diffusion.

2. Description of the Related Art

FIG. 5 is a fragmentary plan view of a known semiconductor device, in particular a power transistor constructed by triple diffusion, FIG. 6 is a sectional side elevational view of the semiconductor device shown in FIG. 5 taken along line 6—6. Referring to these Figures, a semiconductor substrate S has one conductivity type, e.g., N$^-$ type, and a base region 2 of the other conductivity type, e.g., P type, is located at on one principal surface, e.g., obverse surface, of the semiconductor substrate S. An emitter region 3 of N type is formed in the base region 2 by diffusion. An emitter electrode 6 made of, for example, aluminum is disposed on portions of the base region 2 and the emitter region 3 so as to provide an electrical connection between these regions. An emitter terminal E is connected to the emitter electrode 6. A base electrode 9 is located on the exposed portion of the base region 2 and is connected to a base terminal B. The base electrode 9 is surrounded by an oxide film 5. The base region 2 and the emitter region 3 are inter-digitated, and the emitter region 3 has an outer edge, i.e. interface, having a comb-teeth-shaped configuration as denoted by 7.

The emitter region 3 has a vacancy or window 4 substantially in the center of the emitter region 3 defined by an interface, i.e. inner edge, 10 with the base region 2 and through which the base region 2 is exposed at the surface of the substrate. The window 4 provides various facilities. For instance, a diode D can be formed, by using this window 4, between the base region 2 and an N$^+$ type collector region 1 which is formed by diffusion from the other major surface, i.e., the reverse side of the semiconductor substrate S. It is also possible to form a resistor R in the base region 2 between the base electrode 9 and the emitter electrode 6, by making use of the window 4.

The known semiconductor device having the described construction is produced by forming a base region 2 at one side of the semiconductor substrate S by diffusion, followed by formation of the emitter region 3 in the base region 2 by diffusion. The base region 2 and the emitter region 3 form a transistor in cooperation with the collector region 1 formed by a diffusion into the reverse side of the semiconductor substrate S. A diode D is formed between the collector region 1 and the base region 2, and a resistor R is formed in the base region 2. The window 4 in the emitter region 3 also serves to increase the area of junction between the base region 2 and the emitter region 3. The window 4 defines an area in which the base region 2 is exposed to the surface of the device, and the portion of the base region 2 exposed through the window 4 is electrically connected to the emitter region 3 via the emitter electrode 6.

In the semiconductor device having a triple-diffused construction as described, the area of the window 4 formed in the emitter region 3 is so small that current is concentrated in the window 4 in the center of the emitter region 3 during the operation of the semiconductor device. Consequently, the effective operation region of the emitter is materially reduced, with the result that the transistor characteristic $h_{FE}$ is seriously affected.

The restriction in the area of the window 4 is also one of causes of reduction in the secondary yield breakdown strength, i.e., $E_{S/B}$ breakdown strength, of the transistor.

SUMMARY OF THE INVENTION

Accordingly, an object of the present invention is to provide a semiconductor device in which transistor characteristics such as secondary yield breakdown strength are improved to ensure high quality of the device, thereby overcoming the above-described problem of the prior art.

To this end, according to one aspect of the present invention, there is provided a semiconductor device, comprising: a semiconductor substrate; a base region at on one major surface of the semiconductor substrate; an emitter region in the base region and having an outer edge of a predetermined configuration, the emitter region having a window in the emitter region through which the base region is exposed; and a collector region at the other major surface of the substrate wherein the window has a sufficiently large area to reach regions at the outer edge of the emitter region to suppress concentration of electrical current in the window.

According to another aspect of the present invention, there is provided a semiconductor device, comprising: a semiconductor substrate; a base region at on one major surface of the semiconductor substrate; an emitter region in the base region and having an outer edge in a comb-teeth-shaped configuration, the emitter region having a window in the emitter region through which the base region is exposed; and a collector region at the other major surface of the substrate wherein the window has an outer edge in a comb-teeth-shaped configuration extending along the outer edge of the emitter region to suppress concentration of electrical current in the window.

The above and other objects, features and advantages of the invention will become clear from the following description of the preferred embodiments taken in conjunction with the accompanying drawings.

DESCRIPTION OF THE PREFERRED EMBODIMENTS

Figure 1:
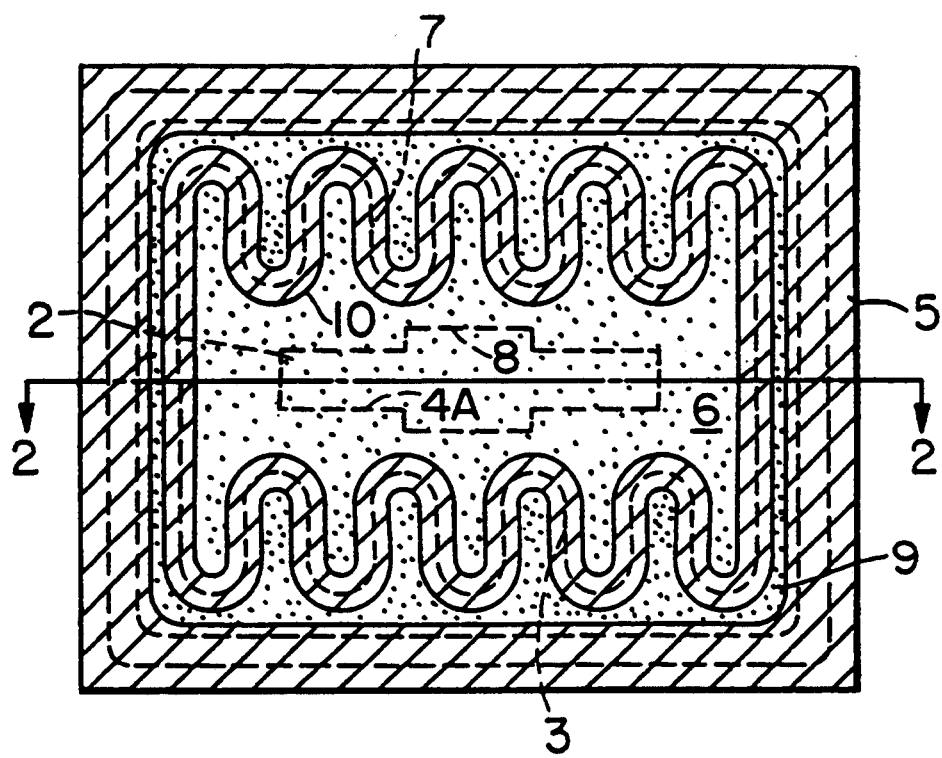
FIG. 1 is a plan view of an embodiment of the semiconductor device in accordance with the present invention.
Figure 2:
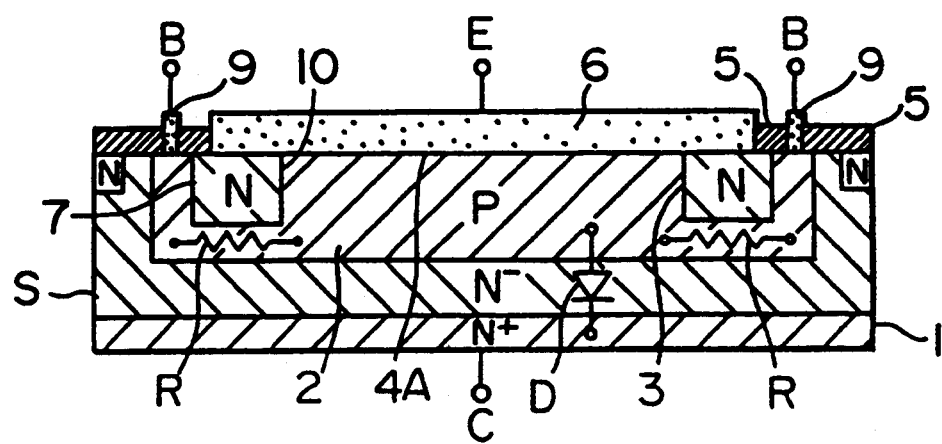
FIG. 2 is a sectional view of the semiconductor device shown in FIG. 1 taken along line 2—2.
Figure 5:
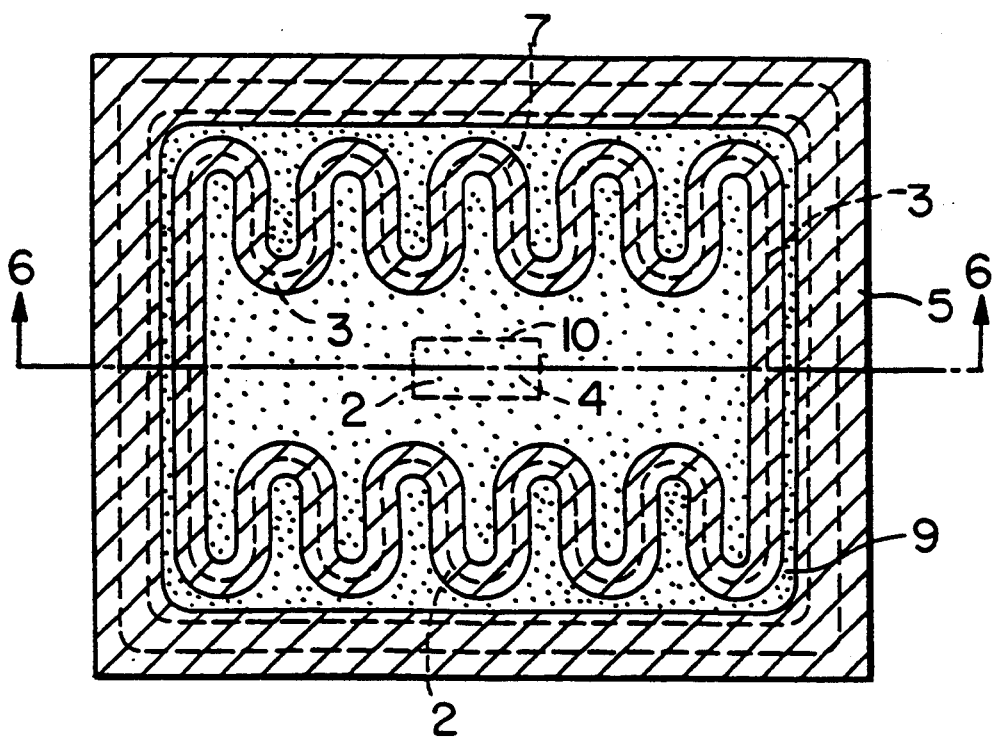
FIG. 5 is a plan view of a known semiconductor device.
Figure 6:
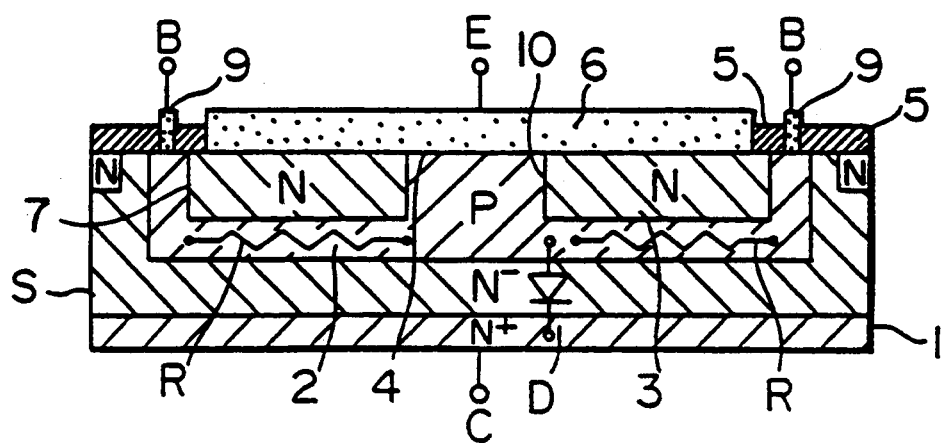
FIG. 6 is a sectional side elevational view of the known semiconductor device shown in FIG. 5 taken along line 6—6.

FIG. 1 is a plan view of a power transistor formed by triple diffusion, an embodiment of the semiconductor device of the present invention. FIG. 2 is a sectional view of the semiconductor device shown in FIG. 1 taken along line 2—2. In these Figures, the same reference numerals are used to denote the same part or portions as those in FIGS. 5 and 6 which were employed in the foregoing description of the related art. As will be seen from FIGS. 1 and 2, the window 4A in the emitter region 3 has a larger area than the area of the window 4 in the known device so as to reach areas near the ends of the comb teeth. The window 4A is defined by an inner edge 8, an interface of the base and emitter regions, and includes projections extending to an edge 7. In this embodiment, the window 4A is expanded to regions near the outer edge 7 of the emitter region 3.

In the semiconductor device having the described construction, a large junction area is obtained between the base region 2 and the emitter region 3 by virtue of the fact that the window 4A with projections 8, having a greater area than the window 4 in known devices, is present. Consequently, concentration of electrical current in the junction surface with the window 4A in the central portion of the emitter region 3 is suppressed. It is therefore possible to prevent degradation of the characteristics of the semiconductor device attributable to concentration of electrical current at the surface of the junction between the emitter region 3 and the window 4A, so that the effective operation region of the emitter is expanded to improve the characteristic $h_{FE}$ of the transistor, thus increasing the secondary yield breakdown voltage of the transistor. It is thus possible to obtain a semiconductor device having high quality.

Figure 3:
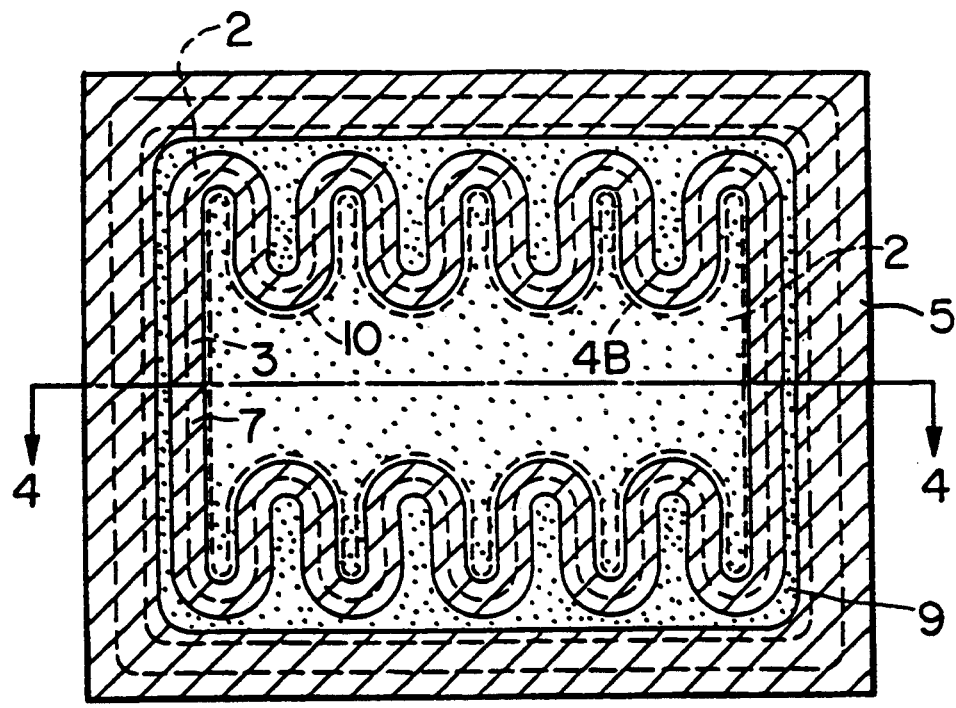
FIG. 3 is a plan view of another embodiment of the semiconductor device in accordance with the present invention.
Figure 4:
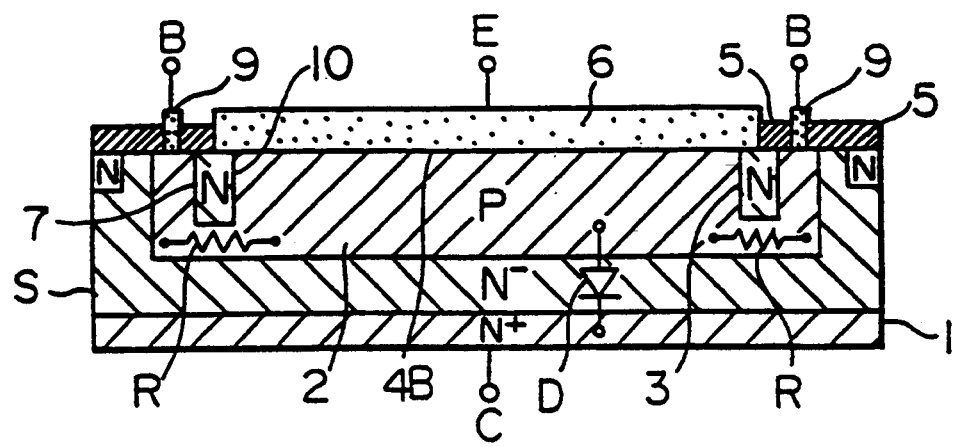
FIG. 4 is a sectional view of the semiconductor device shown in FIG. 3 taken along line 4—4.

FIG. 3 is a plan view of another embodiment of the semiconductor device of the present invention. FIG. 4 is a sectional side elevational view of the semiconductor device shown in FIG. 3 taken along line 4—4. Referring to these Figures, the window 4B has an inner edge 10 having a configuration which meshes with the comb-teeth-like outer configuration of the emitter region 3. According to this arrangement, the emitter region 3 is reduced in size so that the area of the interface between the emitter region 3 and the window 4B at the inner edge 10 is further increased, thus enhancing the effect of suppressing the concentration of the current to the central portion of the emitter region 3. It is therefore possible to further improve the electrical characteristics of the semiconductor device.

The configurations of the windows 4A, 4B shown in FIGS. 1 and 3 are only illustrative and may be modified as desired. For instance, the window formed in the emitter region 3 can have a rectangular configuration or a configuration with a plurality of projections 8.

As will be understood from the foregoing description, according to the present invention, the window formed in the emitter region is widened to the area near the outer edge the emitter region, so that concentration of electrical current in the window portion is suppressed. Consequently, the effective operation region of the emitter is enlarged and electrical characteristics of the semiconductor device such as secondary yield breakdown strength are advantageously improved.

In a specific form of the invention shown in FIGS. 3 and 4, concentration of electrical current in the window is further suppressed by further enlarging the effective operation region of the emitter, while improving the electrical characteristics of the semiconductor device such as secondary yield breakdown strength.

What is claimed is:

1. A semiconductor device comprising:
   a semiconductor substrate having opposed first and second surfaces;
   a base region at the first surface of said semiconductor substrate;
   an emitter region disposed within said base region having an outer edge in a comb-teeth-shaped configuration and an inner edge in a comb-teeth-shaped configuration, the inner edge defining a window through which the base region is exposed at the first surface; and
   a collector region at the second surface of said substrate wherein said outer edge of said emitter region having a comb-teeth-shaped configuration is interdigitated with said inner edge of said emitter region to suppress concentration of electrical current in the window.

2. The semiconductor device of claim 1 including an emitter electrode disposed on the first surface in contact with said emitter region and said base region.

* * * * *